United States Patent
Kushitani et al.

(10) Patent No.: US 7,286,028 B2
(45) Date of Patent: Oct. 23, 2007

(54) SURFACE ACOUSTIC WAVE FILTER AND DEVICE EMPLOYING IT

(75) Inventors: Hiroshi Kushitani, Osaka (JP); Shinobu Nakaya, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 140 days.

(21) Appl. No.: 10/517,827

(22) PCT Filed: Jun. 8, 2004

(86) PCT No.: PCT/JP2004/008280

§ 371 (c)(1),
(2), (4) Date: Dec. 14, 2004

(87) PCT Pub. No.: WO2005/004327

PCT Pub. Date: Jan. 13, 2005

(65) Prior Publication Data
US 2005/0231306 A1   Oct. 20, 2005

(30) Foreign Application Priority Data
Jul. 7, 2003   (JP)   ............... 2003-192653

(51) Int. Cl.
*H03H 9/64* (2006.01)
(52) U.S. Cl. .................. 333/193; 333/195; 310/313 B
(58) Field of Classification Search ................ 333/193, 333/195
See application file for complete search history.

(56) References Cited

U.S. PATENT DOCUMENTS

| | | | | |
|---|---|---|---|---|
| 5,561,406 A | * | 10/1996 | Ikata et al. ................. | 333/126 |
| 5,933,062 A | * | 8/1999 | Kommrusch ................ | 333/193 |
| 6,018,281 A | * | 1/2000 | Taguchi et al. ............. | 333/193 |
| 6,043,585 A | * | 3/2000 | Plessky et al. ........... | 310/313 R |
| 6,107,899 A | | 8/2000 | Taguchi et al. ............. | 333/193 |
| 6,369,672 B1 | * | 4/2002 | Ikada ......................... | 333/193 |
| 6,380,823 B1 | * | 4/2002 | Ikata et al. ................. | 333/133 |
| 6,404,302 B1 | | 6/2002 | Satoh et al. ................ | 333/193 |
| RE37,790 E | * | 7/2002 | Satoh et al. ................ | 333/193 |
| 6,593,678 B1 | * | 7/2003 | Flowers .................. | 310/313 R |
| 2002/0158708 A1 | | 10/2002 | Inoue et al. ................ | 333/133 |

FOREIGN PATENT DOCUMENTS

JP    6-152317    5/1994

(Continued)

*Primary Examiner*—Barbara Summons
(74) *Attorney, Agent, or Firm*—Wenderoth, Lind & Ponack, L.L.P.

(57) ABSTRACT

A surface acoustic wave (SAW) filter includes a first SAW resonator, a second SAW resonator connected in series to the first SAW resonator at a first node, a third SAW resonator connected in series to the second SAW resonator at a second node, a fourth SAW resonator connected in series to the third SAW resonator at a third node, a fifth SAW resonator connected between the first node and ground, a sixth SAW resonator connected between the third node and ground, and a first capacitance element connected between the second node and ground. Further, the SAW filter includes a first inductance element connected in series to the fifth SAW resonator, and a second inductance element connected in series to the sixth SAW resonator. This SAW filter has a sharp attenuation at a high frequency of a pass band, thereby widening the pass band and reducing the loss thereof.

15 Claims, 10 Drawing Sheets

FOREIGN PATENT DOCUMENTS

| | | | |
|---|---|---|---|
| JP | 8-65089 | * | 3/1996 |
| JP | 10-13187 | * | 1/1998 |
| JP | 10-190406 | | 7/1998 |
| JP | 11-41055 | * | 2/1999 |
| JP | 2000-114923 | * | 4/2000 |
| JP | 2002-330055 | | 11/2002 |
| WO | 00/30252 | | 5/2000 |

* cited by examiner

SURFACE ACOUSTIC WAVE FILTER AND DEVICE EMPLOYING IT

BACKGROUND OF THE INVENTION

1. Field of the Invention

The present invention relates to a surface acoustic wave filter used in a communication device and a device using the filter.

2. Description of the Related Art

Figure 15:
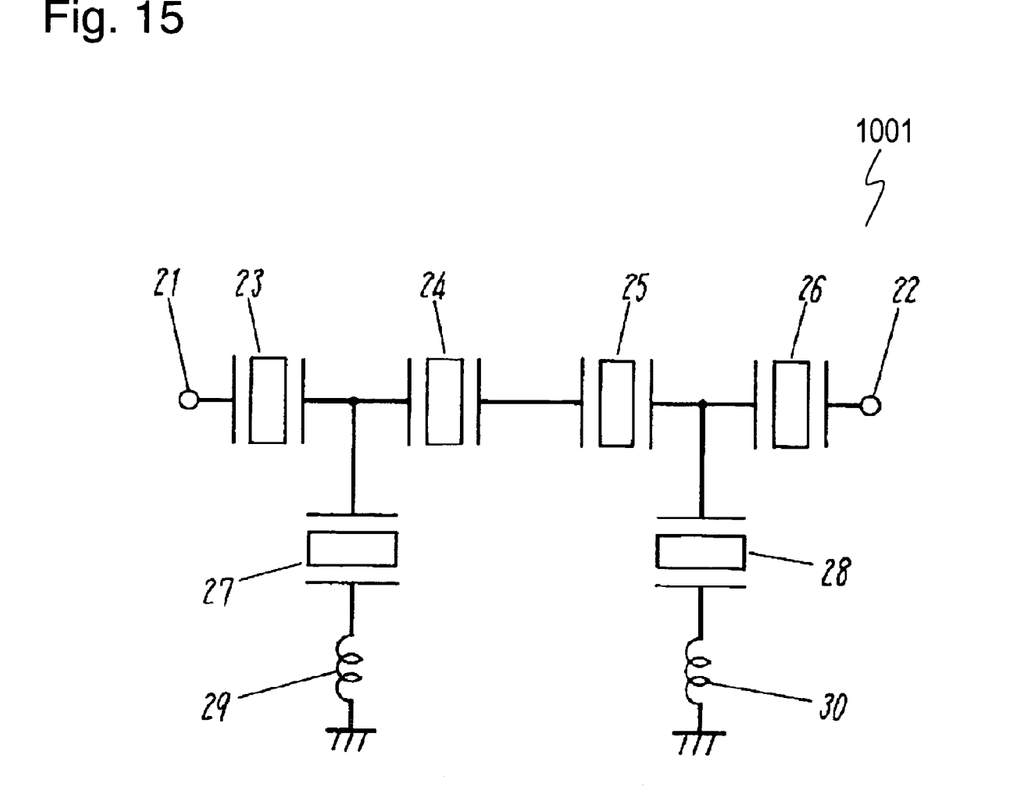
FIG. 15 is a circuit diagram of a conventional SAW filter.

FIG. 15 shows conventional ladder type surface acoustic wave (SAW) filter 1001 disclosed in Japanese Patent Laid-Open Publication No. 6-152317. Series resonators 23, 24, 25 and 26 are connected between input terminal 21 and output terminal 22 in series in this order from input terminal 21 to output terminal 22. One end of parallel resonator 27 is connected with a point between series resonators 23 and 24. One end of parallel resonator 28 is connected with a point between series resonators 25 and 26. Other end of parallel resonator 27 is connected with a ground via inductance element 29 providing an inductance. Other end of parallel resonator 28 is connected with a ground via inductance element 30 providing an inductance.

Figure 2:
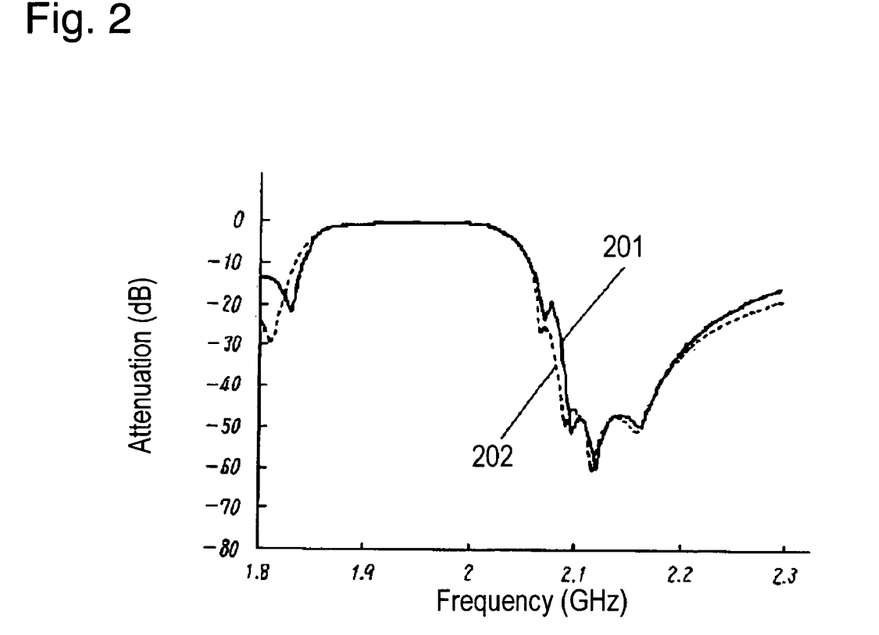
FIG. 2 shows frequency characteristics of the SAW filter in accordance with the embodiment.
Figure 3:
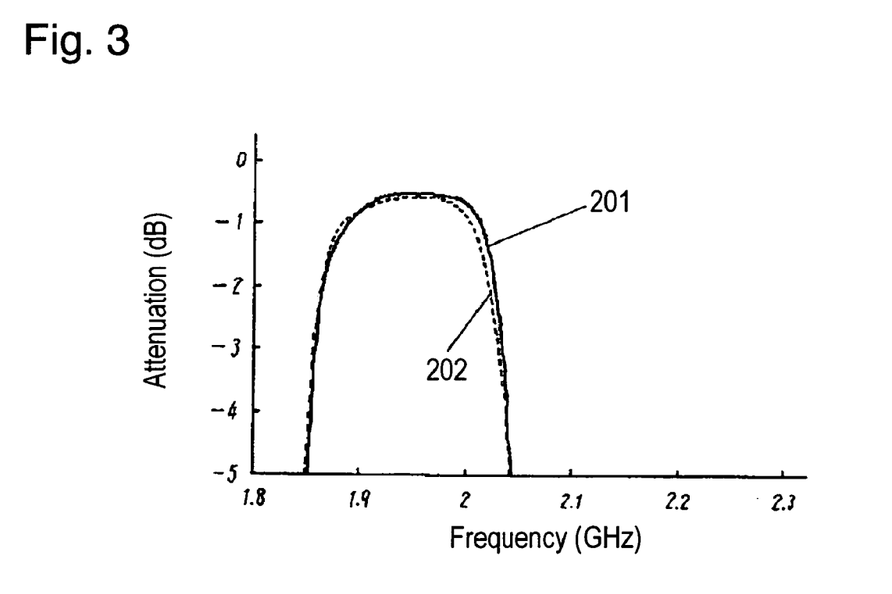
FIG. 3 shows frequency characteristics of the SAW filter in accordance with the embodiment.

SAW filter 1001 has characteristics denoted by line 202 in FIGS. 2 and 3. As shown by line 202, SAW filter 1001 has attenuation bands at both sides of a pass band. The filter, such as SAW filter 1001, is required to have characteristics reducing a loss in the pass band and shifting sharply to the attenuation bands.

SUMMARY OF THE INVENTION

A surface acoustic wave (SAW) filter includes a first SAW resonator, a second SAW resonator connected in series to the first SAW resonator at a first node, a third SAW resonator connected in series to the second SAW resonator at a second node, a fourth SAW resonator connected in series to the third SAW resonator at a third node, a fifth SAW resonator connected between the first node and a ground, a sixth SAW resonator connected between the third node and a ground, and a first capacitance element having a capacitance and connected between the second node and a ground. The SAW filter further includes a first inductance element connected in series to said fifth SAW resonator, and a second inductance element connected in series to said sixth SAW resonator.

This SAW filter has a sharp attenuation characteristic at a high frequency area of a pass band, thereby widening the pass band and reducing a loss at the pass band.

DETAILED DESCRIPTION OF THE INVENTION

Figure 1:
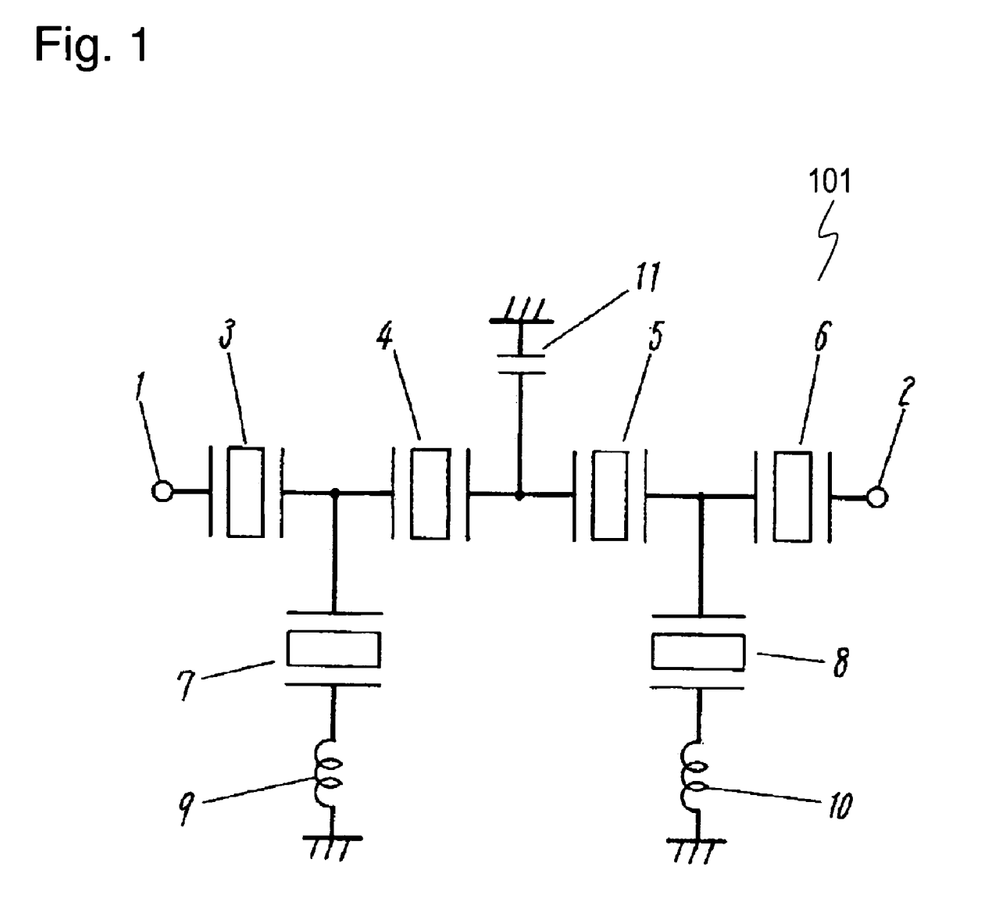
FIG. 1 is a circuit diagram of a surface acoustic wave (SAW) filter in accordance with an exemplary embodiment of the present invention.

FIG. 1 is a circuit diagram of surface acoustic wave (SAW) filter 101 in accordance with an exemplary embodiment of the present invention. Series resonators 3-6 are connected in series in this order from input terminal 1 to output terminal 2 between input terminal 1 and output terminal 2. One end of parallel resonator 7 is connected to a node between series resonators 3 and 4. One end of parallel resonator 8 is connected to a node between series resonators 5 and 6. Other end of parallel resonator 7 is connected with a ground via inductance element 9 having an inductance. Other end of parallel resonator 8 is connected with a ground via inductance element 10 having an inductance. Capacitance element 11 having a capacitance is connected between a ground and series resonators 4 and 5.

FIGS. 2 and 3 show frequency characteristics of SAW filter 101 in accordance with the embodiment.

As shown by line 201 in FIG. 2, SAW filter 101 of the present invention has a loss at a pass band from 1.92 GHz to 1.98 GHz less than a loss (shown by line 202) of conventional SAW filter 1001 shown in FIG. 15. SAW filter 101 has an attenuation at both sides of the pass band more than an attenuation (shown by line 202) of conventional SAW filter 1001, and the attenuation of SAW filter 101 is sharper than the attenuation (shown by line 202) of SAW filter 1001. SAW filter 101 of the embodiment has a larger bandwidth and a smaller loss than the conventional SAW filter 1001.

Figure 4:
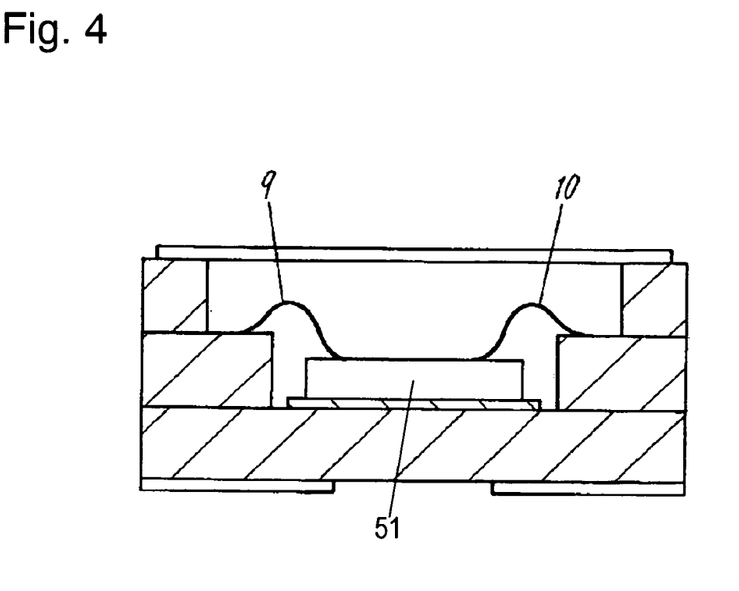
FIG. 4 is a sectional view of the SAW filter in accordance with the embodiment.
Figure 5:
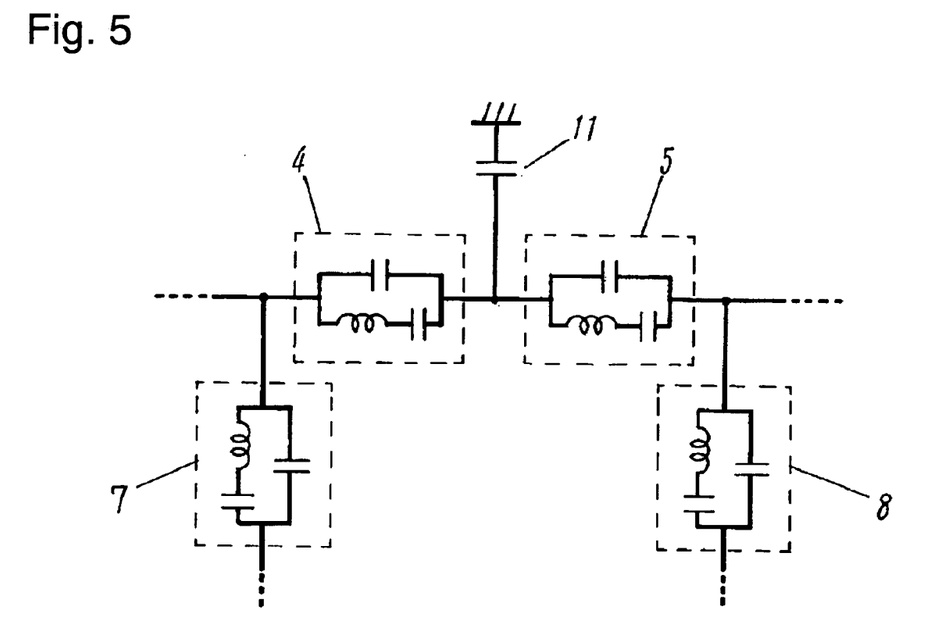
FIG. 5 shows an equivalent circuit of the SAW filter in accordance with the embodiment.

FIG. 4 is a sectional view of SAW filter 101 in accordance with the embodiment. Inductance elements 9 and 10 are formed of wires connected with piezoelectric board 51 having resonators 3-8 provided thereon. FIG. 5 is an equivalent circuit of a portion of SAW filter 101 shown in FIG. 1. In general, respective self parallel resonances of series resonators 3-6 greatly contribute to attenuation at high frequencies of the pass band of the SAW filter 101. Additionally, in general, respective self series resonances of parallel resonators 7 and 8 greatly contribute to attenuation at low frequencies in the pass band of SAW filter 101. In general, respective self series resonances of series resonators 3-6 and respective parallel resonances of parallel resonators 7 and 8 greatly contribute to characteristics in the pass band of SAW filter 101. An attenuation characteristic has been conventionally designed by controlling these resonators. A ratio of the series resonance to the parallel resonance is determined substantially by conditions of the piezoelectric board having these resonators thereon.

Figure 6:
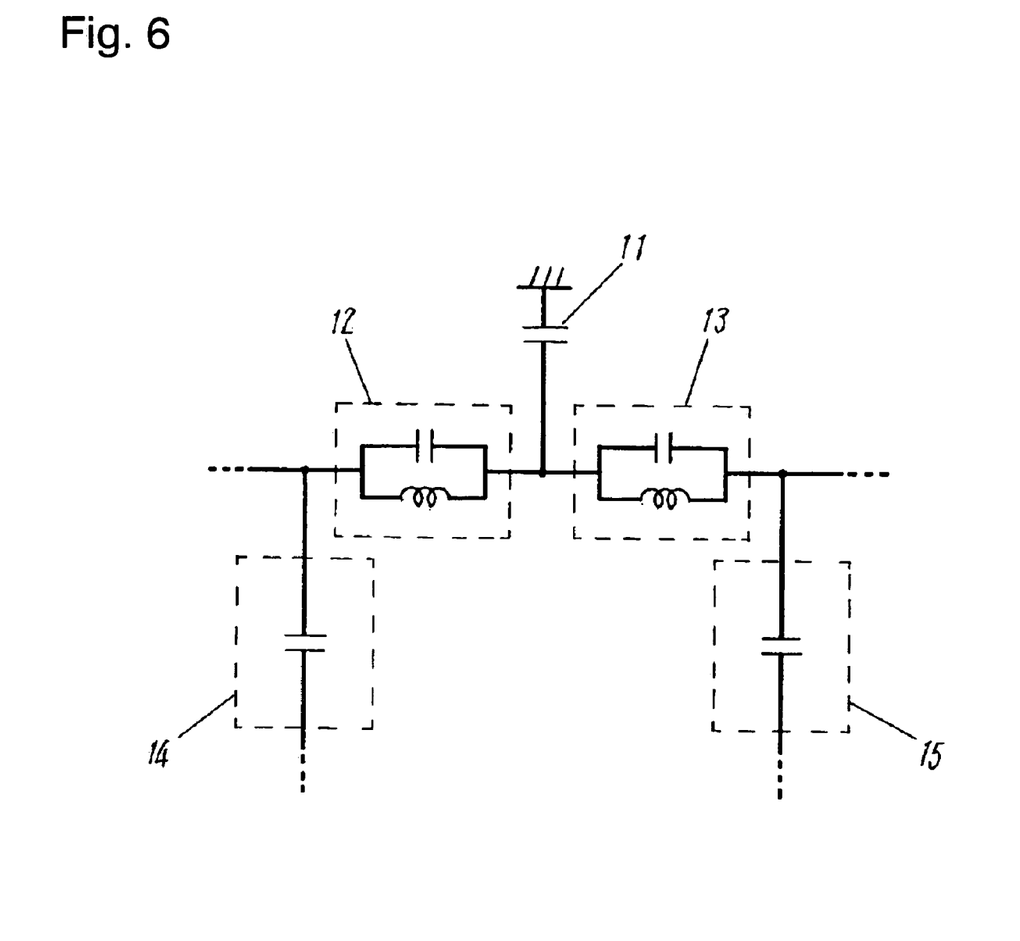
FIG. 6 shows an equivalent circuit of the SAW filter in accordance with the embodiment.

FIG. 6 is an equivalent circuit around an attenuation pole at high frequencies of SAW filter 101 having the equivalent circuit shown in FIG. 5. In this equivalent circuit, series resonators 4 and 5 correspond to parallel resonant circuits 12 and 13, respectively, and parallel resonators 7 and 8 correspond to capacitors 14 and 15, respectively. The equivalent circuit including capacitance element 11 shown in FIG. 6 is approximated to an elliptic function type band-pass filter around the attenuation pole at high frequencies.

As a result, SAW filter 101 has a large, sharp attenuation at high frequencies, thus having a wide bandwidth and a small loss, as shown by line 201 in FIG. 3.

For example, the capacitance of capacitance element 11 is determined to be 0.1 pF, and series resonators 3-6 and parallel resonators 7 and 8 are designed appropriately, thus reducing a loss in the pass band (from 1.92 GHz to 1.98 GHz) from −0.9 dB (shown by line 202) to −0.8 dB (shown by line 201), as shown in FIG. 3.

Capacitance element 11 may be formed on the piezoelectric board similarly to series resonators 3-6 and parallel resonators 7 and 8. A method of the forming will be described.

Figure 7:
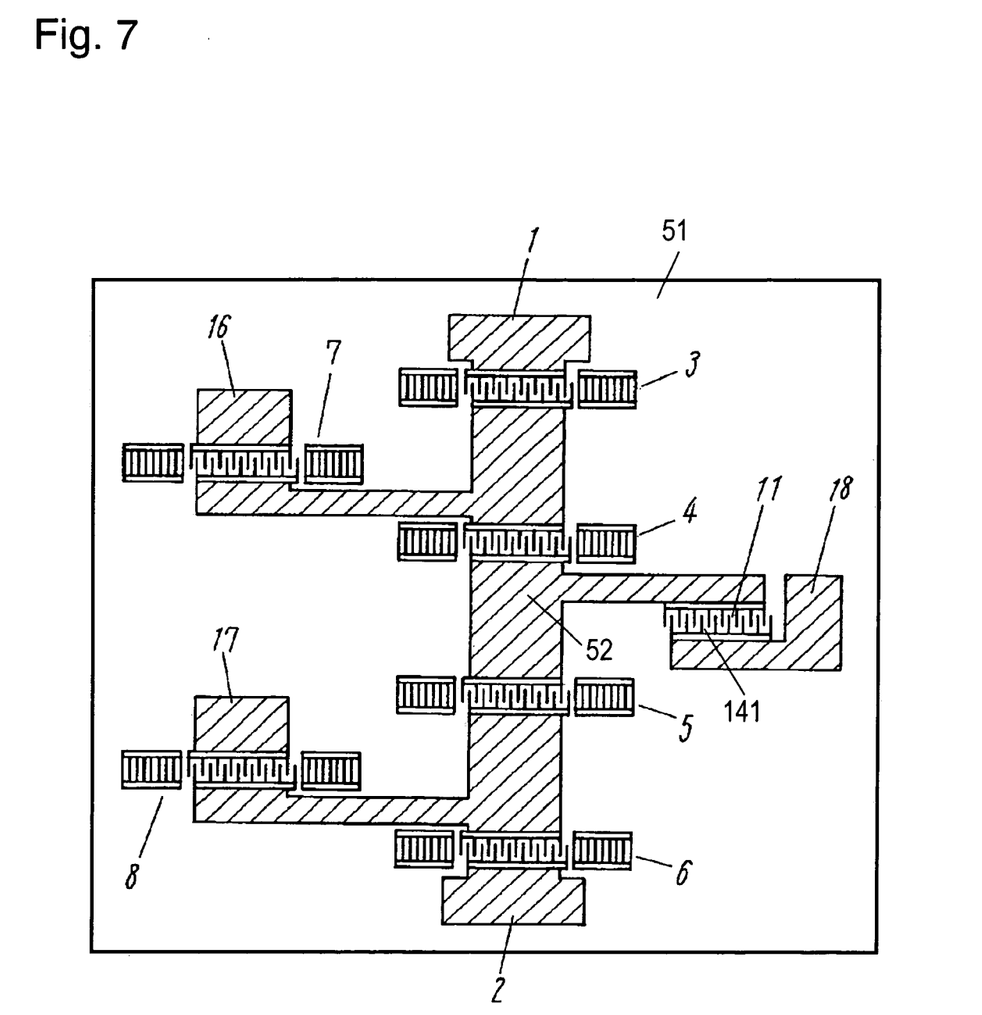
FIG. 7 is a plan view of the SAW filter in accordance with the embodiment.

FIG. 7 is a plan view of the SAW filter 101 of the present invention. Input terminal 1, output terminal 2, series resonators 3-6, parallel resonators 7 and 8, ground electrodes 16-18 and capacitance element 11 are formed on piezoelectric board 51. Capacitance element 11 is composed of interdigital electrodes 141 extending from ground electrode 18 and node 52 between series resonators 4 and 5, respectively, and facing each other.

Figure 8:
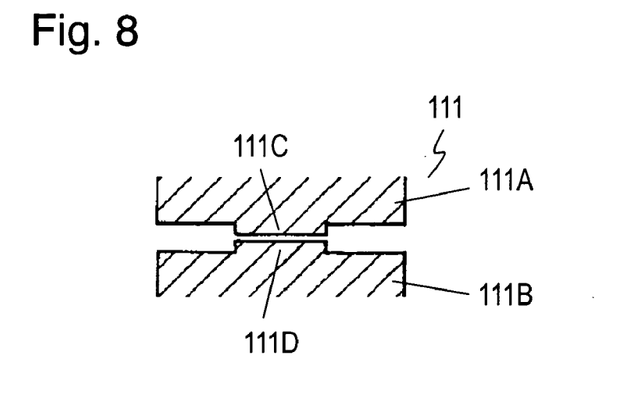
FIG. 8 is a plan view of a capacitance element of the SAW filter in accordance with the embodiment.
Figure 9:
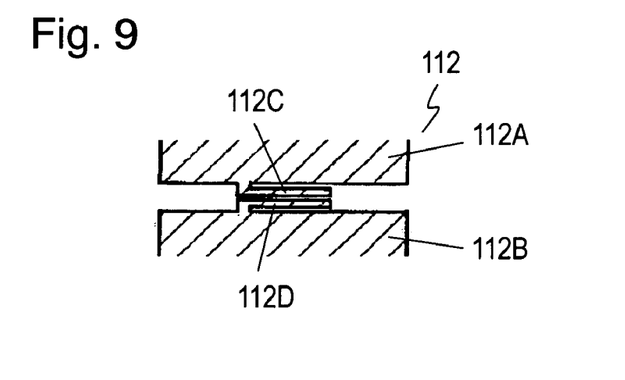
FIG. 9 is a plan view of another capacitance element of the SAW filter in accordance with the embodiment.
Figure 10:
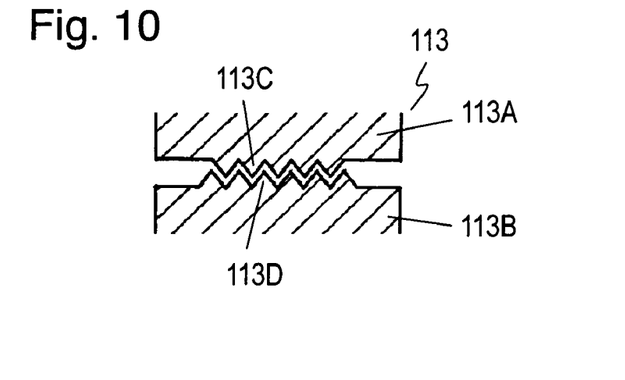
FIG. 10 is a plan view of a further capacitance element of the SAW filter in accordance with the embodiment.

FIGS. 8-10 are plan views of other capacitance elements 111-113. In capacitance element 111 shown in FIG. 8, portions 111C and 111D protrude from respective long sides of electrodes 111A and 111B, respectively. Electrode 111A extends from node 52 between series resonators 4 and 5. Electrode 111B extends from ground electrode 18 and face electrode 11A. In capacitance element 112 shown in FIG. 9, electrodes 112C and 112D protrude from electrodes 112A and 112B, respectively, and extend in parallel to each other. Electrode 112A extends from node 52 between series resonators 4 and 5. Electrode 112B extends from ground electrode 18. In capacitance element 113 shown in FIG. 10, toothed portions 113C and 113D are formed at electrodes 113A and 113B. Electrode 113A extends from node 52 between series resonators 4 and 5. Electrode 113B extends from ground electrode 18 and face electrode 113A.

Figure 11:
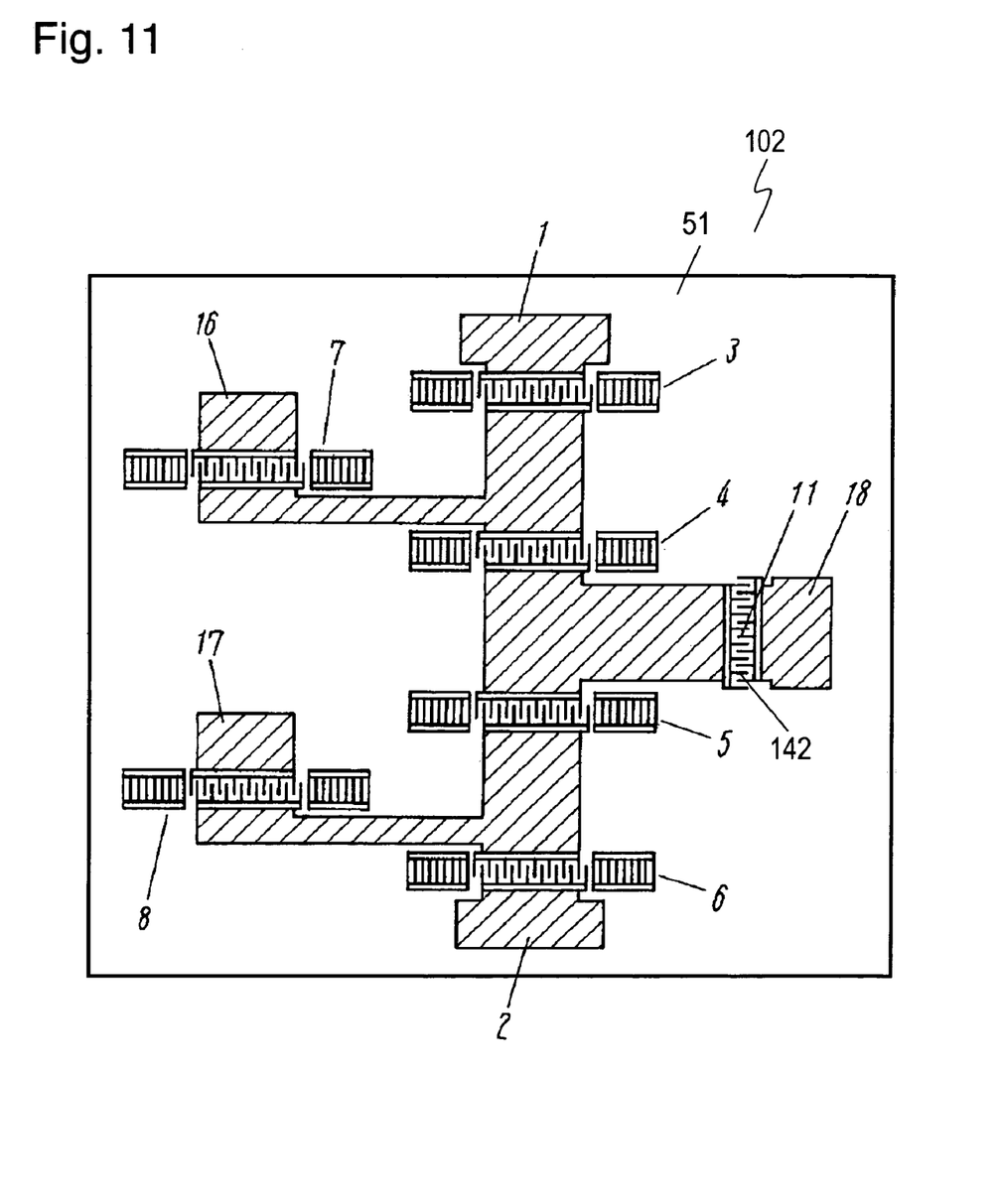
FIG. 11 is a plan view of another SAW filter in accordance with the embodiment.

FIG. 11 is a plan view of another SAW filter 102 of the present invention. Interdigital electrodes 142, differently interdigital electrodes 11 forming capacitance element 141 shown in FIG. 10, are formed perpendicularly to series resonators 3-6 and parallel resonators 7 and 8. The number of fingers and intervals of interdigital electrodes 141 and 142 are determined by the capacitances. Since directions of interdigital electrodes 142 is different from directions of interdigital electrodes of the resonators by 90 degrees, interdigital electrodes 142 do not resonate with surface acoustic waves of the resonators. As a result, vibrations of the resonators do not influence capacitance element 11 regardless of the capacitance of capacitance element 11.

Figure 12:
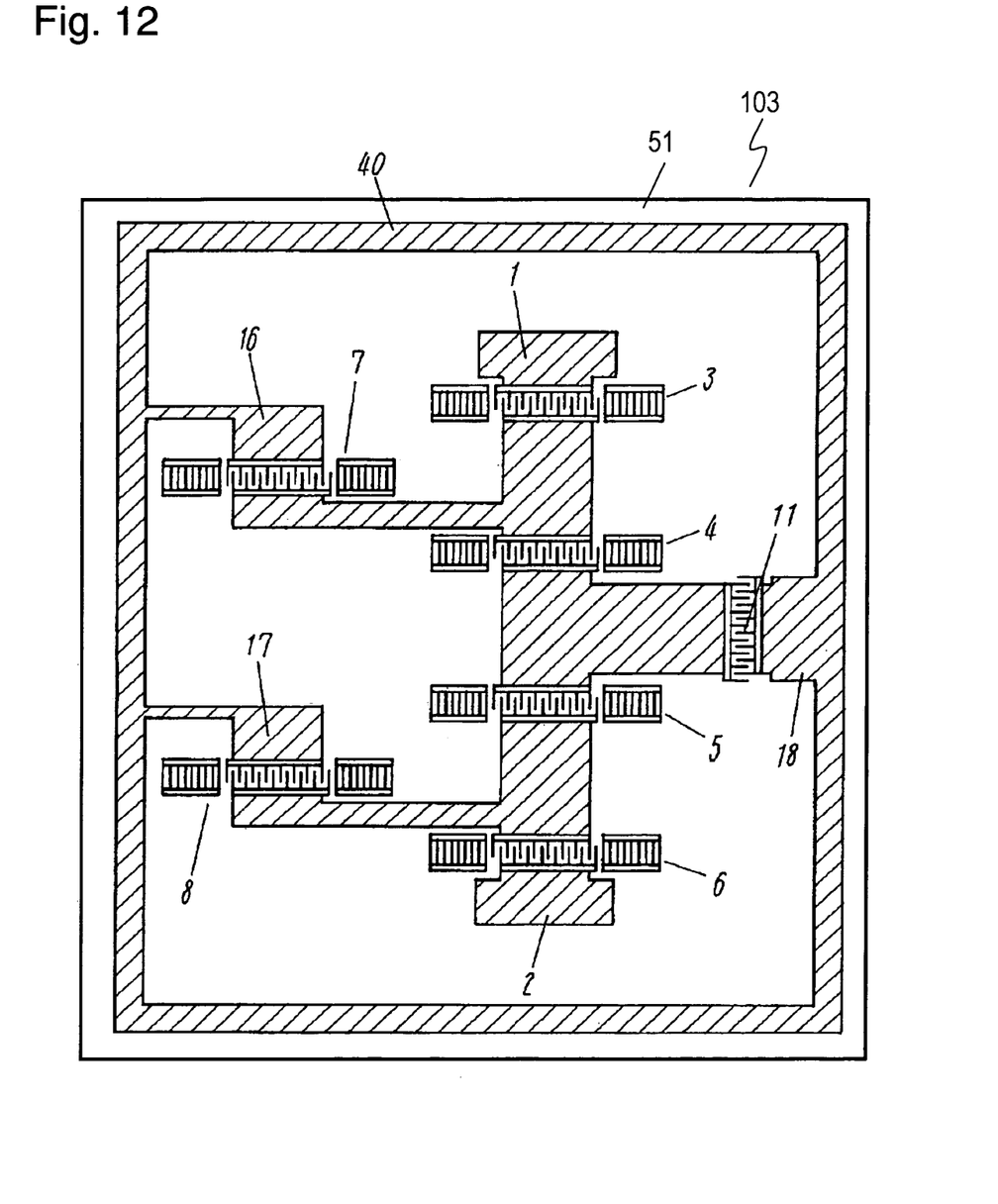
FIG. 12 is a plan view of a further SAW filter in accordance with the embodiment.

FIG. 12 is a plan view of further SAW filter 103 of the present invention. Ground electrodes 16-18 are connected with ground electrode 40 surrounding elements of SAW filter 103 on piezoelectric board 51. This structure prevents the electrodes from breaking due to short-circuit between the electrodes caused by electric charges accumulating at piezoelectric board 51 during forming of the elements on piezoelectric board 51. Ground electrode 40 functions as a mark when a wafer of a piezoelectric board having plural SAW filters formed thereon is divided into the SAW filters. After the wafer is divided into the SAW filters, ground electrode 40 is eliminated, thereby not influencing characteristics of SAW filter 103.

Figure 13:
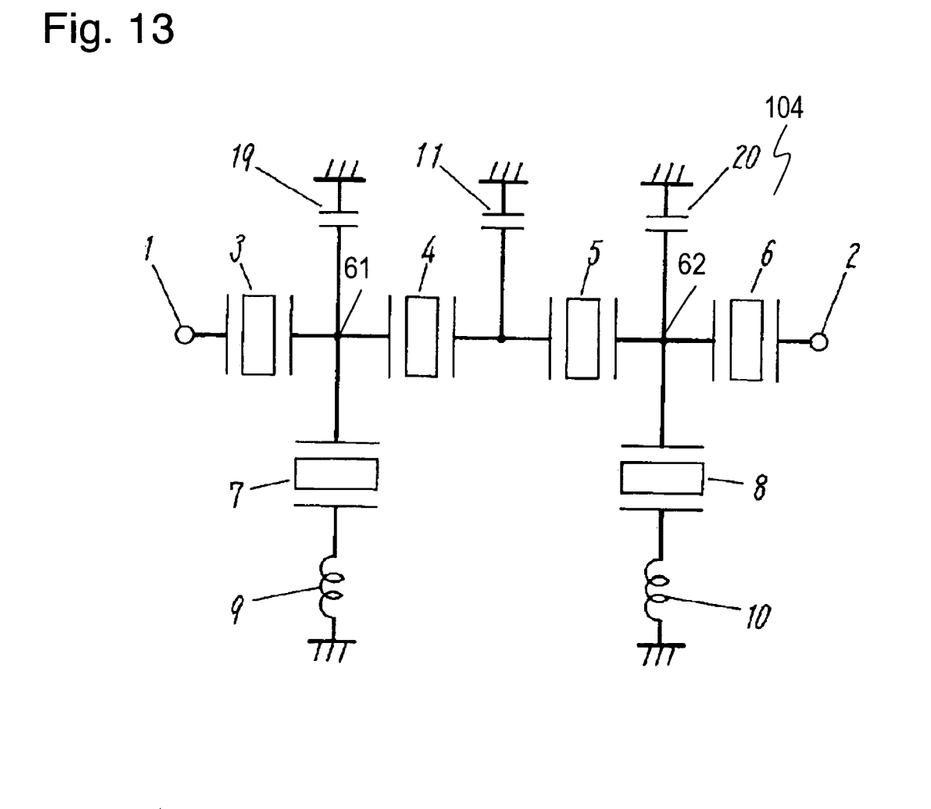
FIG. 13 is a circuit diagram of a still further SAW filter in accordance with the embodiment.

FIG. 13 is a circuit diagram of SAW filter 104 of the present invention. Capacitance element 19 is connected between a ground and node 61 between series resonators 3 and 4. Capacitance element 20 is connected between a ground and node 62 between series resonators 5 and 6. In SAW filter 104, parallel resonators 7 and 8 forming an equivalent elliptic function band-pass filter may be designed flexibly at high frequencies of an attenuation band. Capacitance elements 19 and 20 may have the same structure as capacitance element 11.

Figure 14:
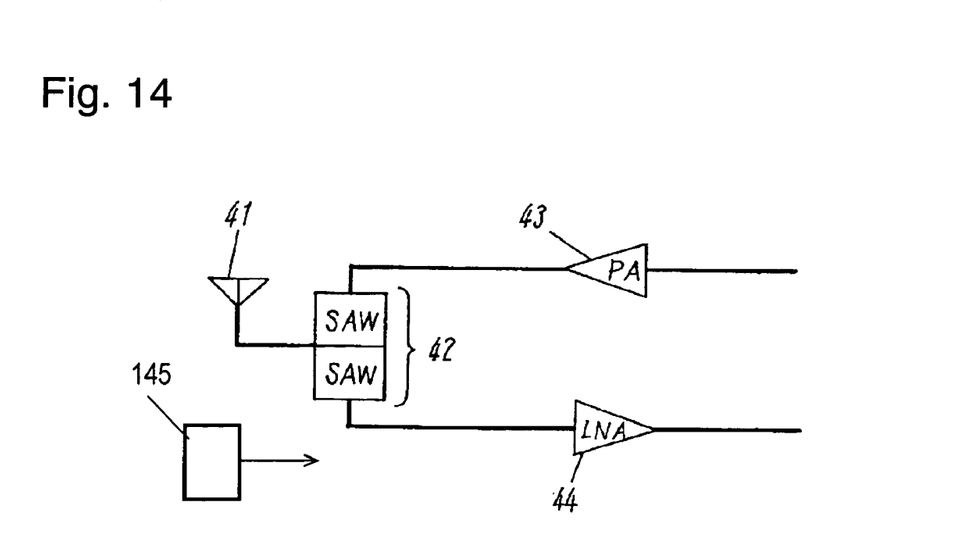
FIG. 14 is a block diagram of a device including the SAW filter in accordance with the embodiment.

FIG. 14 is a block diagram of a device including SAW filters 101-104 and other elements, such as antenna 41 and amplifiers 43 and 44, in accordance with the embodiment. Duplexer 42 including the SAW filter connected with antenna 41 is connected with power amplifier 43 for sending and power amplifier 44 for receiving. The device shown in FIG. 14 may be a portable telephone including rechargeable battery 145 for supplying electric power to duplexer 42 and amplifiers 43 and 44. For example, in the cases that battery capacity W of battery 145 is 580 mAh, an effect of reduction of a loss at the pass band of the SAW filter by 0.1 dB will be described.

Efficiency η(%) of the portable telephone is calculated by the following equation:

$$\eta = 10^{(Pout/10)}/(1000 \times V \times I) \times 100$$

where a voltage of battery 145 is V(V), a consumption current is I(A), and an output voltage of radio wave from antenna 41 is Pout(dBm).

In the case that the voltage V=3(V) and the efficiency η=40(%) are constant, when Pout is 33 (dBm), the consumption current of battery 145 is reduced by approximately 38.73 (mA) from that of Pout of 33.1 (dBm). If the portable telephone makes a call for 120 minutes with battery 145, a duration T of call in the case that the consumption current is reduced by 38.73 (mA) is expressed as the following equation:

$$T = 120 \times (580 + 38.73)/580 \approx 128$$

Thus, when a loss at the pass band of the SAW filter is reduced by 0.1 dB, the duration of call of the portable telephone increases by eight minutes.

INDUSTRIAL APPLICABILITY

A surface acoustic wave (SAW) filter of the present invention has sharp attenuation characteristics at high frequencies in a pass band, thereby having a wide pass band and a small loss at the pass band.

The invention claimed is:

1. A surface acoustic wave (SAW) filter comprising:
   a first SAW resonator;
   a second SAW resonator connected in series to said first SAW resonator at a first node;
   a third SAW resonator connected in series to said second SAW resonator at a second node;
   a fourth SAW resonator connected in series to said third SAW resonator at a third node;
   a fifth SAW resonator connected between the first node and a ground;
   a sixth SAW resonator connected between the third node and a ground;
   a first capacitance element having a capacitance and being connected between the second node and a ground;

a first inductance element connect between said fifth SAW resonator and the ground such that said fifth SAW resonator and said first inductance element are connected in series;

a second inductance element connected between said sixth SAW resonator and the ground such that said sixth SAW resonator and said second inductance element are connected in series;

a piezoelectric board having a surface including said first to sixth SAW resonators and said first capacitance element disposed thereon;

a first electrode, arranged on said surface of said piezoelectric board, and extending from one of the second node and the ground, said first electrode having a first edge; and a second electrode, arranged on said surface of said piezoelectric board, and extending from another of the second node and the ground, said second electrode having a second edge parallel to and facing said first edge of said first electrode, wherein said first capacitance element includes:

a third electrode, arranged on said surface of said piezoelectric board, and extending from said first edge of said first electrode; and a fourth electrode, arranged on said surface of said piezoelectric board, extending from said second edge of said second electrode, and facing said third electrode in a direction perpendicular to said first and second edges with a gap formed therebetween.

2. The SAW filter of claim 1, further comprising a second capacitance element having a capacitance and being connected between the first node and the ground.

3. The SAW filter of claim 2, further comprising a third capacitance element having a capacitance and being connected between the third node and the ground.

4. A device comprising:
said SAW filter of claim 3; and
an element connected to said SAW filter.

5. A device comprising:
said SAW filter of claim 2; and
an element connected to said SAW filter.

6. The SAW filter of claim 2, wherein said second capacitance elements further includes:

a fifth electrode, arranged on said surface of said piezoelectric board, and extending from the second node; and a sixth electrode, arranged on said surface of said piezoelectric board, and extending from the ground and facing said fifth electrode.

7. The SAW filter of claim 6, wherein said fifth electrode and said sixth electrode have toothed portions facing each other, respectively.

8. The SAW filter of claim 1, wherein:

said third electrode includes a first portion extending from said first edge and a second portion extending from said first portion parallel to said first edge and said second edge, so that a gap is located between said first edge and said second portion of said third electrode; and said fourth electrode includes a first portion extending from said second edge and a second portion extending from said first portion parallel to said first edge, said second edge, and said second portion of said third electrode, so that a gap is formed between said second edge and said second portion of said fourth electrode.

9. The SAW filter of claim 8, wherein:

said first portion and said second portion of said third electrode form an L-shape; and said first portion and said second portion of said fourth electrode form an L-shape.

10. The SAW filter of claim 1, wherein said third electrode and said fourth electrode have toothed portions facing each other, respectively.

11. A device comprising:
said SAW filter of claim 10; and
an element connected to said SAW filter.

12. A device comprising:
said SAW filter of claim 1; and
an element connected to said SAW filter.

13. The SAW filter of claim 1, wherein said first inductance element comprises a wire connected to said piezoelectric board.

14. The SAW filter of claim 1, wherein said second inductance element comprises a wire connected to said piezoelectric board.

15. The SAW filter of claim 1, wherein said fourth electrode is parallel to said second edge of said second electrode.

* * * * *

UNITED STATES PATENT AND TRADEMARK OFFICE
CERTIFICATE OF CORRECTION

PATENT NO. : 7,286,028 B2
APPLICATION NO. : 10/517827
DATED : October 23, 2007
INVENTOR(S) : Hiroshi Kushitani et al.

It is certified that error appears in the above-identified patent and that said Letters Patent is hereby corrected as shown below:

ON THE TITLE PAGE

On page 1, left column, in Section (54), "employing it" should be --using the same--.

In column 5, claim 6, line 44, "elements" should be --element--.

Signed and Sealed this

First Day of April, 2008

JON W. DUDAS
*Director of the United States Patent and Trademark Office*